(12) United States Patent
Sakanoue et al.

(10) Patent No.: US 11,097,619 B2
(45) Date of Patent: Aug. 24, 2021

(54) CURRENT COLLECTOR MONITORING SYSTEM

(71) Applicant: CENTRAL JAPAN RAILWAY COMPANY, Nagoya (JP)

(72) Inventors: Kei Sakanoue, Nagoya (JP); Isao Naruse, Nagoya (JP); Kotaro Nakamura, Nagoya (JP); Masayuki Ueno, Nagoya (JP); Noriyuki Taniyama, Nagoya (JP); Shigekazu Okada, Nagoya (JP)

(73) Assignee: CENTRAL JAPAN RAILWAY COMPANY, Nagoya (JP)

( * ) Notice: Subject to any disclaimer, the term of this patent is extended or adjusted under 35 U.S.C. 154(b) by 351 days.

(21) Appl. No.: 16/322,294

(22) PCT Filed: Aug. 2, 2016

(86) PCT No.: PCT/JP2016/072668
§ 371 (c)(1),
(2) Date: Jan. 31, 2019

(87) PCT Pub. No.: WO2018/025329
PCT Pub. Date: Feb. 8, 2018

(65) Prior Publication Data
US 2019/0160951 A1    May 30, 2019

(51) Int. Cl.
| | | |
|---|---|---|
| *B60L 3/12* | (2006.01) | |
| *B60L 5/18* | (2006.01) | |
| *G06T 7/00* | (2017.01) | |
| *B60L 13/00* | (2006.01) | |
| *B60L 15/00* | (2006.01) | |

(Continued)

(52) U.S. Cl.
CPC .................. *B60L 3/12* (2013.01); *B60L 5/18* (2013.01); *B60L 13/006* (2013.01); *B60L 15/002* (2013.01); *G01H 1/00* (2013.01); *G01R 31/008* (2013.01); *G06T 7/0002* (2013.01);

(Continued)

(58) Field of Classification Search
CPC ........ B60L 3/12; B60L 13/006; B60L 15/002; B60L 5/18; B60L 2200/30; G06T 7/0004; G06T 7/0002; G06T 2207/30252; G01H 1/00; G01R 31/008; Y02T 10/64
See application file for complete search history.

(56) References Cited

FOREIGN PATENT DOCUMENTS

| | | |
|---|---|---|
| JP | S63182507 A1 | 7/1988 |
| JP | 2003319505 A | 11/2003 |

(Continued)

OTHER PUBLICATIONS

Machine Translation of JP2005-249503 (Year: 2005).*

(Continued)

*Primary Examiner* — Alan D Hutchinson
(74) *Attorney, Agent, or Firm* — David D. Brush; Westman, Champlin & Koehler, P.A.

(57) ABSTRACT

A current collector monitoring system in one aspect of the present disclosure is provided with: a collected current measurement unit; a collected current state determination unit; an image acquisition unit; an event recognition unit; an event determination unit; and a determination result output unit. When a state of collected current corresponds to an abnormal state, the image acquisition unit acquires an image including, within an angle of view, a collector shoe provided to a current collector.

20 Claims, 5 Drawing Sheets

(51) Int. Cl.
*G01H 1/00* (2006.01)
*G01R 31/00* (2006.01)

(52) U.S. Cl.
CPC ......... *G06T 7/0004* (2013.01); *B60L 2200/30* (2013.01); *G06T 2207/30252* (2013.01)

(56) References Cited

FOREIGN PATENT DOCUMENTS

| JP | 2005249503 A | 9/2005 |
| JP | 4386253 B2 | 12/2009 |
| JP | 2010169506 A | 8/2010 |
| JP | 2012191778 A | 10/2012 |

OTHER PUBLICATIONS

Machine Translation of JP2003-319505 (Year: 2003).*
Machine Translation of JPS63-182507 (Year: 1989).*
Machine Translation of JP2012-191778 (Year: 2012).*
English Translation of Taiwanese Office Action dated May 1, 2020 for corresponding Taiwan Application No. 105124415.
English Translation of the Written Opinion of the International Searching Authority dated Oct. 25, 2016 for corresponding International Application No. PCT/JP2016/072668, filed Aug. 2, 2016.
International Search Report dated Oct. 12, 2016 for corresponding International Application No. PCT/JP2016/072668, filed Aug. 2, 2016.
Written Opinion of the International Searching Authority dated Oct. 25, 2016 for corresponding International Application No. PCT/JP2016/072668, filed Aug. 2, 2016.

* cited by examiner

CURRENT COLLECTOR MONITORING SYSTEM

CROSS-REFERENCE TO RELATED APPLICATIONS

This Application is a Section 371 National Stage Application of International Application No. PCT/JP2016/072668, filed Aug. 2, 2016, which is incorporated by reference in its entirety and published as WO 2018/025329 A1 on Feb. 8, 2018, not in English.

TECHNICAL FIELD

The present disclosure relates to a current collector monitoring system.

BACKGROUND ART

A railroad vehicle is provided with a current collector on its roof. The current collector has a structure that supports a collector shoe with a current collecting arm. The collector shoe includes a shoe body, and a contact strip attached to an upper surface of the shoe body, and is configured to press the contact strip against a lower edge of an overhead line so as to draw electricity from the overhead line to an electric train (See Patent Document 1).

PRIOR ART DOCUMENTS

Patent Documents

Patent Document 1: Japanese Patent No. 4386253

SUMMARY OF THE INVENTION

Problems to be Solved by the Invention

Various failures may occur in the current collector. Examples of such various failures include deformation of the collector shoe caused by a bird colliding with the collector shoe, and adhesion of foreign matter to the collector shoe.

In one aspect of the present disclosure, it is desirable to provide a current collector monitoring system that enables early detection of failures related to a current collector.

Means for Solving the Problems

A current collector monitoring system in one aspect of the present disclosure comprises: a collected current measurement unit configured to measure a collected current collected by a current collector; a collected current state determination unit configured to determine whether a state of the collected current corresponds to a preset abnormal state; an image acquisition unit configured to acquire an image including a collector shoe provided in the current collector within an angle of view when the state of the collected current corresponds to the abnormal state; an event recognition unit configured to recognize an event related to the collector shoe in the image; an event determination unit configured to determine whether the event corresponds to a preset abnormal event; and a determination result output unit configured to output a signal containing a result of determination made by the event determination unit.

This current collector monitoring system enables early detection of failures related to the current collector. Also, the current collector monitoring system acquires an image in case that the state of the collected current corresponds to the abnormal state. Therefore, as compared to a method of constantly acquiring an image, a load of processing executed by the current collector monitoring system can be reduced.

A current collector monitoring system in another aspect of the present disclosure comprises: a vibration measurement unit configured to measure vibration of a collector shoe provided in a current collector; a vibration state determination unit configured to determine whether a state of the vibration corresponds to a preset abnormal state; an image acquisition unit configured to acquire an image including the collector shoe within an angle of view when the state of the vibration corresponds to the abnormal state; an event recognition unit configured to recognize an event related to the collector shoe in the image; an event determination unit configured to determine whether the event corresponds to a preset abnormal event; and a determination result output unit configured to output a signal containing a result of determination made by the event determination unit.

This current collector monitoring system enables early detection of failures related to the current collector. Also, the current collector monitoring system acquires an image in case that the state of the vibration of the collector shoe corresponds to the abnormal state. Therefore, as compared to the method of constantly acquiring an image, a load of processing executed by the current collector monitoring system can be reduced.

EXPLANATION OF REFERENCE NUMERALS

1 . . . current collector monitoring system, 3 . . . current collector, 5 . . . roof, 7, 9 . . . insulator, 10 . . . railroad vehicle, 11 . . . base, 13 . . . collector shoe, 15 . . . current collecting arm, 17 . . . distribution cable, 19 . . . wind shield, 21 . . . control device, 23 . . . first camera, 25 . . . second camera, 27 . . . acceleration sensor, 29 . . . first clamp meter, 31 . . . second clamp meter, 33 . . . vehicle speed sensor, 35 . . . GPS, 37 . . . output current sensor, 39 . . . driving cab monitor, 41 . . . communication device, 43 . . . operation center, 45 . . . vehicle control unit, 47 . . . storage unit, 49 . . . collected current measurement unit, 51 . . . collected current state determination unit, 53 . . . vibration measurement unit, 55 . . . vibration state determination unit, 57 . . . image acquisition unit, 59 . . . event recognition unit, 61 . . . event determination unit, 63 . . . determination result output unit, 65 . . . vehicle control unit, 67 . . . control result output unit, 69 . . . vehicle information acquisition unit

MODE FOR CARRYING OUT THE INVENTION

Example embodiments of the present disclosure will be described with reference to the drawings.

First Embodiment

1. Configuration of Current Collector Monitoring System 1

Configuration of a current collector monitoring system (hereinafter, simply referred to as "monitoring system") 1 will be described with reference to FIGS. 1 and 2. The monitoring system 1 is mounted on a railroad vehicle 10. The railroad vehicle 10 includes two or more current collectors 3 shown in FIG. 2. FIG. 2 shows one of the current collectors 3 for simplification. The monitoring system 1 is provided for each current collector 3. Hereinafter, the current collector 3 monitored by the monitoring system 1 is sometimes referred to as the current collector 3 corresponding to the monitoring system 1.

The current collector 3 is mounted on a roof 5 of the railroad vehicle 10. The current collector 3 includes insulators 7, 9, a base 11, a collector shoe 13, and a current collecting arm 15.

The insulators 7, 9 fix the base 11 on the roof 5. The current collecting arm 15 extends diagonally upward from one side in a front-rear direction of the base 11 (traveling direction of the railroad vehicle 10) to the other side to support the collector shoe 13. The current collecting arm 15 can swing in a direction of arrow shown in FIG. 2, and is biased in a direction to push up the collector shoe 13 with a not shown spring.

The collector shoe 13 comes into contact with a not shown overhead line, and draws electricity from an overhead line into the railroad vehicle 10. Electricity drawn by the collector shoe 13 is transmitted to a distribution cable 17 via a not shown cable which passes through the current collector 3. A wind shield 19 for reducing wind noise caused by the current collector 3 is provided on the roof 5.

Figure 1:
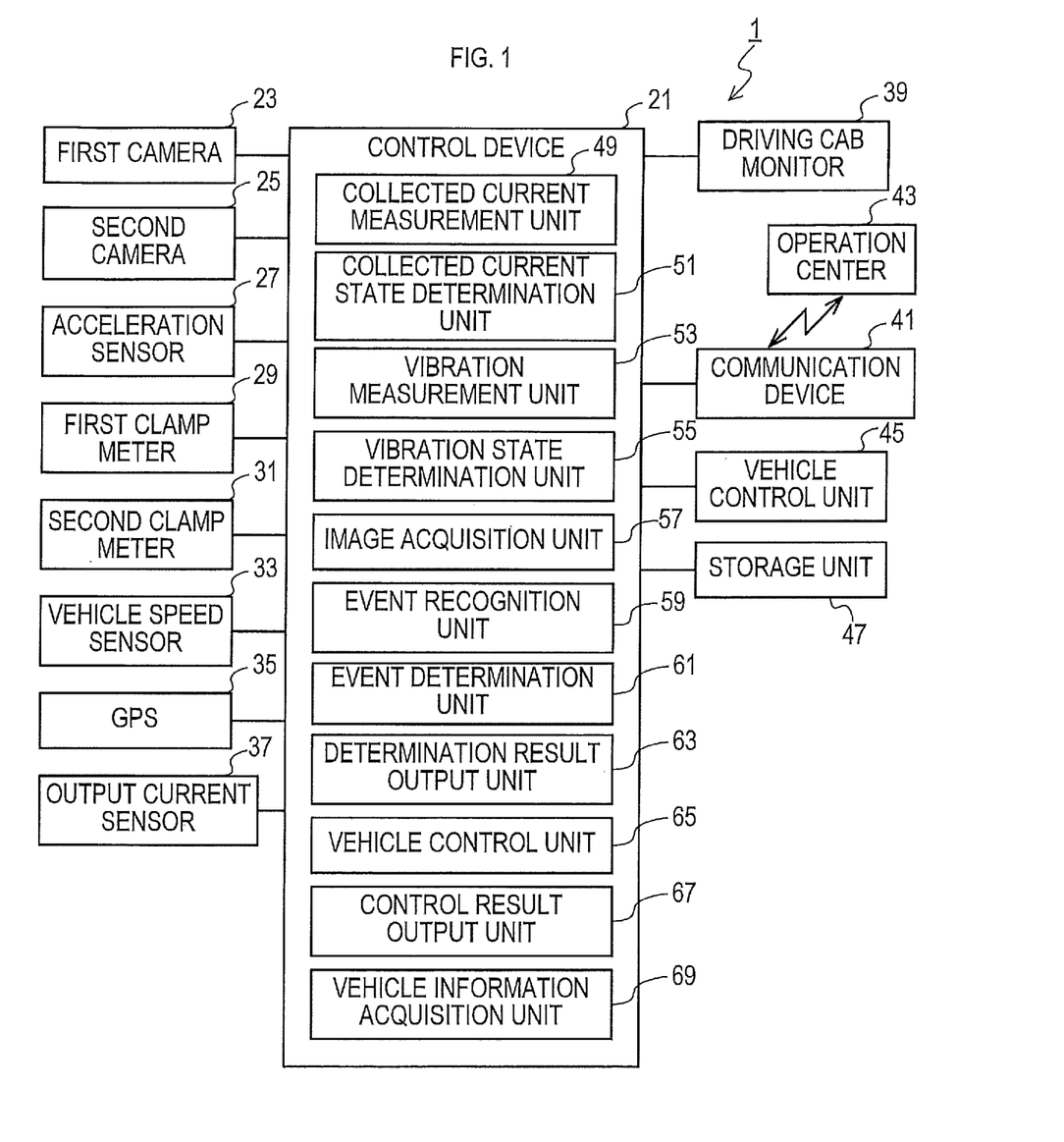
FIG. 1 is a block diagram showing a configuration of a current collector monitoring system.
Figure 2:
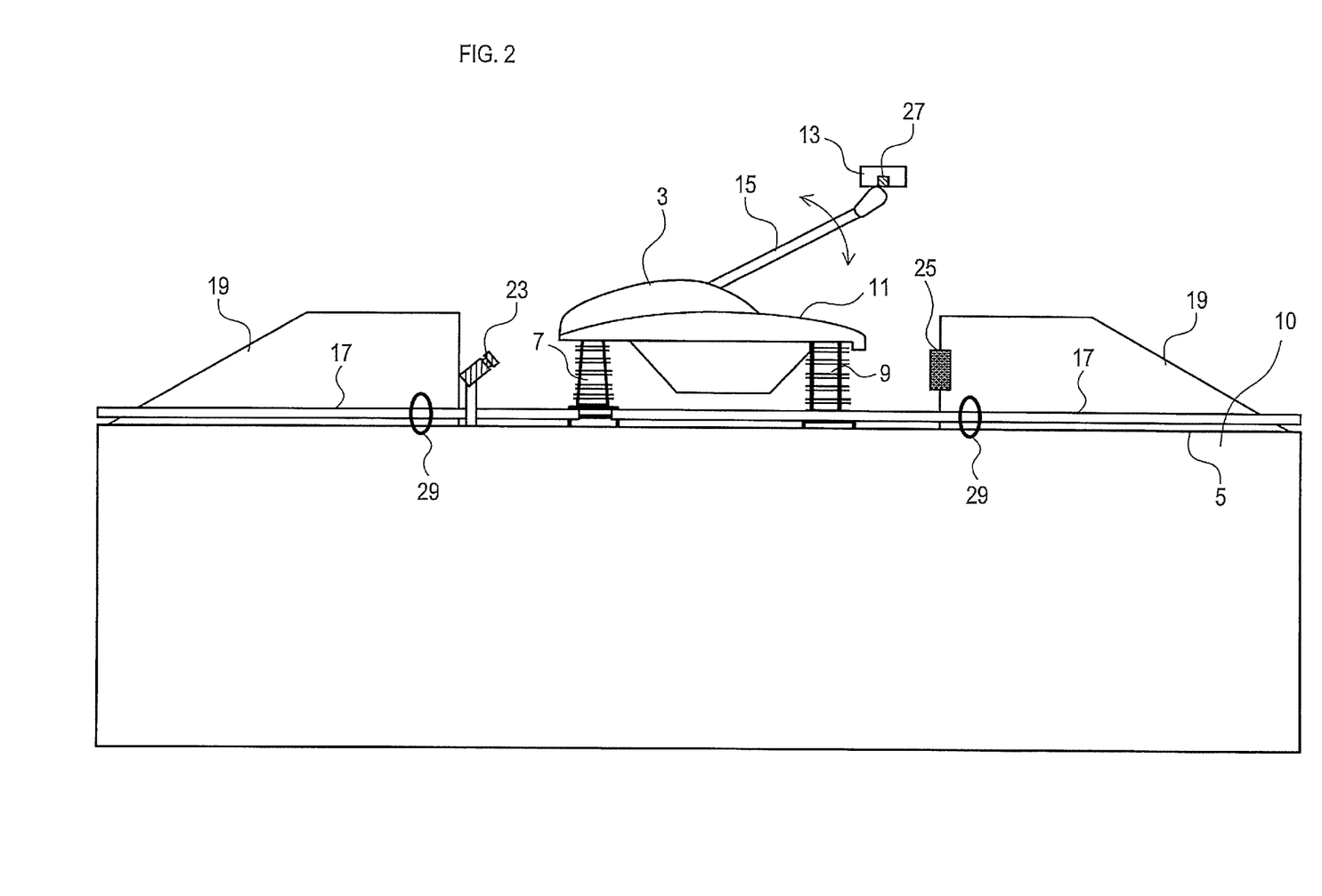
FIG. 2 is an explanatory view showing an arrangement of a current collector, a first camera, a second camera, an acceleration sensor, and a first clamp meter.

As shown in FIG. 1, the monitoring system 1 comprises a control device 21, a first camera 23, a second camera 25, an acceleration sensor 27, a first clamp meter 29, a second clamp meter 31, a vehicle speed sensor 33, a GPS 35, an output current sensor 37, a driving cab monitor 39, a communication device 41, a vehicle control unit 45, and a storage unit 47.

The control device 21 is a known computer provided with a CPU, a RAM, a ROM and so on. The control device 21 executes a later-described process by a program stored in the ROM. The control device 21 functionally comprises a collected current measurement unit 49, a collected current state determination unit 51, a vibration measurement unit 53, a vibration state determination unit 55, an image acquisition unit 57, an event recognition unit 59, an event determination unit 61, a determination result output unit 63, a vehicle control unit 65, a control result output unit 67, and a vehicle information acquisition unit 69. Functions of the respective units will be described later.

The first camera 23 is installed on the roof 5, as shown in FIG. 2. The collector shoe 13 is included within an angle of view of the first camera 23. The first camera 23 has a preferable sensitivity wavelength for recognizing the collector shoe 13 in a captured image.

The second camera 25 is installed on the roof 5, as shown in FIG. 2. The collector shoe 13 is included within an angle of view of the second camera 25. The second camera 25 has a preferable sensitivity wavelength for recognizing an arc light generated between the collector shoe 13 and the overhead line in a captured image.

The acceleration sensor 27 is installed in the collector shoe 13, as shown in FIG. 2. The acceleration sensor 27 can measure each acceleration in an up-down direction, a front-rear direction, and a width direction (direction orthogonal to a paper surface in FIG. 2) of the collector shoe 13.

The first clamp meter 29, as shown in FIG. 2, measures a value of a collected current (hereinafter, referred to as corresponding collected current) in the distribution cable 17 coupled to the current collector 3 corresponding to the monitoring system 1.

The second clamp meter 31 measures a value of a collected current (hereinafter, referred to as adjacent collected current) in the distribution cable 17 coupled to the current collector 3 adjacent to the current collector 3 corresponding to the monitoring system 1.

The vehicle speed sensor 33 measures a speed of the railroad vehicle 10. The GPS 35 acquires a position of the railroad vehicle 10. The output current sensor 37 measures an output current value of the railroad vehicle 10 (current value of a driving current of the railroad vehicle 10).

The driving cab monitor 39 is provided at a driver seat (not shown) of the railroad vehicle 10 and can display an image. The communication device 41 can wirelessly communicate with an operation center 43 existing outside the railroad vehicle 10. The vehicle control unit 45 controls the speed and the like of the railroad vehicle 10. The storage unit 47 comprises a hard disc drive and the like, and can store various information.

2. Process Executed by Monitoring System 1

Figure 3:
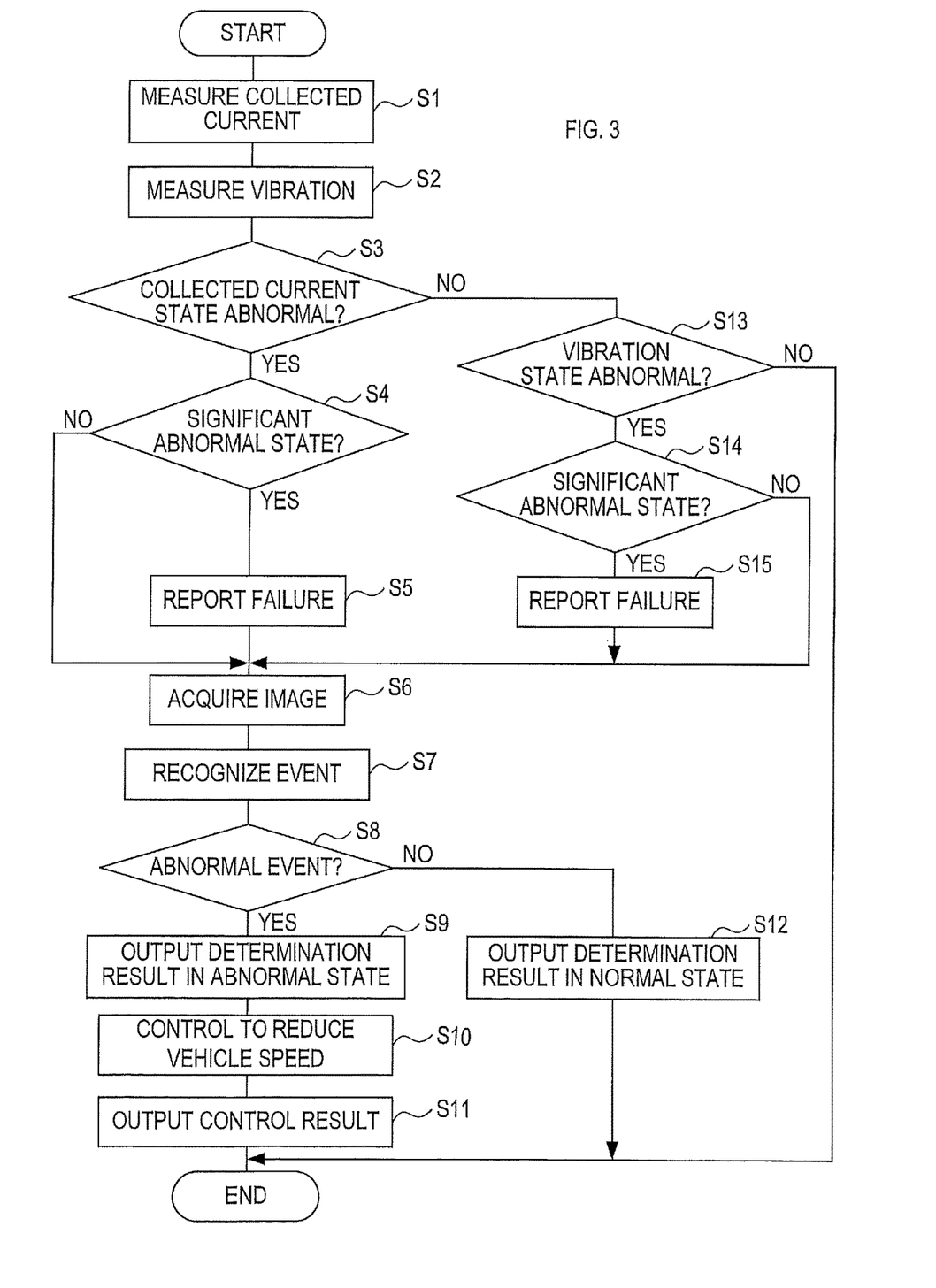
FIG. 3 is a flowchart showing a process executed by the current collector monitoring system according to a first embodiment.

A process repeatedly executed by the monitoring system 1 (especially, control device 21) at a specific cycle will be described with reference to FIG. 3. "S" in FIG. 3 represents step. The same applies to "S" in FIGS. 4 and 5 to be explained later. In Step 1 of FIG. 3, the collected current measurement unit 49, using the first clamp meter 29, measures a value of the corresponding collected current continuously for a specified period of time. In addition, the collected current measurement unit 49, using the second clamp meter 31, measures a value of the adjacent collected current continuously for a specified period of time. The result of measurement is stored in the storage unit 47.

In Step 2, the vibration measurement unit 53, using the acceleration sensor 27, measures the accelerations of the collector shoe 13 continuously for a specified period of time. As a result, data of the accelerations of the collector shoe 13 changing in time series can be acquired. The data represents vibration of the collector shoe 13. In Step 2, in addition to the measurement of the accelerations, the speed of the railroad vehicle 10 is measured using the vehicle speed sensor 33. The data of the accelerations of the collector shoe 13 changing in time series and the speed of the railroad vehicle 10 are stored in the storage unit 47 in association with each other.

In Step 3, the collected current state determination unit 51 determines whether a state of the collected current measured in Step 1 corresponds to a preset abnormal state. The abnormal state includes the following states (a1) to (a3).

State (a1): a state in which a magnitude of the corresponding collected current is out of a preset normal range. The normal range may have an upper limit value and a lower limit value, only have an upper limit value, or only have a lower limit value.

State (a2): a state in which, in a result of measurement of the corresponding collected current, frequency of occurrence of no current state is equal to or higher than a threshold value. The no current state herein means a state in which the value of the corresponding collected current is 0 or close to 0. The frequency of occurrence means the number of occurrences of no current state per unit time.

State (a3): a state in which a difference in magnitude of the current values between the corresponding collected current and the adjacent collected current (deviation in magnitude of the collected current between the current collectors) is equal to or higher than a threshold value.

In case that the state of the collected current corresponds to any one of the states (a1) to (a3), the process proceeds to Step 4. Otherwise, the process proceeds to Step 13.

In Step 4, the collected current state determination unit 51 determines whether the abnormal state is significant.

For example, in case that the collected current is in the state (a1), it is determined that the abnormal state is significant when a difference between the magnitude of the corresponding collected current and the upper limit value or the lower limit value of the normal range exceeds a specified value. Otherwise, it is not determined that the abnormal state is significant.

In case that the collected current is in the state (a2), it is determined that the abnormal state is significant when a difference between the frequency of occurrence of no current state and the threshold value exceeds a specified value. Otherwise, it is not determined that the abnormal state is significant.

In case that the collected current is in the state (a3), it is determined that the abnormal state is significant when a difference between the deviation in magnitude of the collected current between the current collectors and the threshold value exceeds a specified value. Otherwise, it is not determined that the abnormal state is significant.

When the abnormal state is significant, the process proceeds to Step 5. If the abnormal state is not significant, then the process proceeds to Step 6.

In Step 5, the determination result output unit 63 outputs a failure signal to the driving cab monitor 39, and, using the communication device 41, transmits the failure signal to the operation center 43. The driving cab monitor 39 displays a warning image in accordance with the failure signal.

In Step 6, the image acquisition unit 57, using the first camera 23 and the second camera 25, acquires an image. The acquired image is stored in the storage unit 47.

In Step 7, the event recognition unit 59 recognizes events related to the collector shoe 13 in the image acquired in Step 6. Examples of the events related to the collector shoe 13 include: a shape of the collector shoe 13; adhesion of a foreign matter to the collector shoe 13; operation of the collector shoe 13 (for example, cycle or amplitude in up-down movement); inclination of the collector shoe 13; and an arc light generated between the collector shoe 13 and the overhead line.

The shape of the collector shoe 13, adhesion of a foreign matter to the collector shoe 13, operation of the collector shoe 13, and inclination of the collector shoe can be recognized in the image acquired using the first camera 23. Also, the arc light generated between the collector shoe 13 and the overhead line can be recognized in the image acquired using the second camera 25.

A well-known recognition technique (for example, pattern recognition technique) can be used for recognition of the events related to the collector shoe 13.

In Step 8, the event determination unit 61 determines whether the event related to the collector shoe 13 recognized in Step 7 corresponds to a preset abnormal event. Examples of the abnormal event include the following events (e1) to (e6).

Event (e1): a difference between the shape of the collector shoe 13 recognized in the image acquired in Step 6 and the natural shape of the collector shoe 13 (degree of deformation of the collector shoe 13) is equal to or greater than a specified threshold value.

Event (e2): a foreign matter adhering to the collector shoe 13 has a size equal to or greater than a specified threshold value.

Event (e3): mode of operation of the collector shoe 13 is out of a preset normal range. For example, the collector shoe 13 has amplitude or cycle in up-down movement out of the normal range.

Event (e4): the collector shoe 13 has an inclination equal to or greater than a threshold value.

Event (e5): frequency of occurrence of arc lights is equal to or greater than a threshold value.

Event (e6): one arc light has a duration equal to or greater than a threshold value.

If the event related to the collector shoe 13 corresponds to the abnormal event, then the process proceeds to Step 9. If the event does not correspond to the abnormal event, then the process proceeds to Step 12.

In Step 9, the determination result output unit 63 outputs to the driving cab monitor 39 a signal (hereinafter, referred to as abnormal event signal) including a result of determination that the event related to the collector shoe 13 corresponds to the abnormal event, and, using the communication device 41, transmits the signal to the operation center 43. The driving cab monitor 39 displays, in accordance with the abnormal event signal, an image reporting that the abnormal event has occurred.

The determination result output unit 63 also outputs vehicle information to the driving cab monitor 39 together with the abnormal event signal and transmits the vehicle information to the operation center 43. The vehicle information includes the speed of the railroad vehicle 10, the position of the railroad vehicle 10, and an output current value of the railroad vehicle 10. The driving cab monitor 39 displays the vehicle information.

The speed of the railroad vehicle 10 is acquired by a vehicle information acquisition unit 69, using the vehicle speed sensor 33. The position of the railroad vehicle 10 is acquired by the vehicle information acquisition unit 69, using the GPS 35. The output current value of the railroad vehicle 10 is acquired by the vehicle information acquisition unit 69, using the output current sensor 37.

The determination result output unit 63 also outputs the image acquired in Step 6 to the driving cab monitor 39 together with the abnormal event signal and the vehicle information, and transmits the image to the operation center 43. The driving cab monitor 39 displays the image.

In Step 10, the vehicle control unit 65, using the vehicle control unit 45, performs control to reduce the speed of the railroad vehicle 10. The control to reduce the speed may be control (notch down or notch off) to reduce the driving current of the railroad vehicle 10, or may be control to apply a brake.

In Step 11, the control result output unit 67 outputs to the driving cab monitor 39 a signal specific to a case in which the process in Step 10 has been performed, and transmits the signal to the operation center 43.

On the other hand, when it is negatively determined in the Step 8, the process proceeds to Step 12. The determination result output unit 63 outputs to the driving cab monitor 39 a signal including a result of determination that the event related to the collector shoe 13 does not correspond to the abnormal event, and transmits the signal to the operation center 43.

When it is negatively determined in Step 3, the process proceeds to Step 13. In Step13, the vibration state determination unit 55 determines whether a state of the vibration of the collector shoe 13 indicated in the data acquired in Step 2 corresponds to a preset abnormal state. The abnormal state includes the following states (b1) and (b2).

State (b1): a state in which an amplitude of the vibration is equal to or greater than a threshold value.

State (b2): a state in which a ratio R is smaller than a threshold value. The ratio R is a ratio of the amplitude when the speed of the railroad vehicle 10 is at a second speed (high speed) higher than a first speed (low speed) to the amplitude at the first speed. The first speed and the second speed can be set in advance. Also, the first speed and the second speed can be a section having a constant width with respect to speed.

As to the state (b2), the ratio R is calculated as follows. When the data acquired in previous Step 2 is the data acquired at the first speed, data acquired at the second speed in the past is read out from the storage unit 47. The ratio R is calculated from the data acquired in previous Step 2 and the data read out from the storage unit 47.

When the data acquired in previous Step 2 is the data acquired at the second speed, data acquired at the first speed in the past is read out from the storage unit 47. The ratio R is calculated from the data acquired in previous Step 2 and the data read out from the storage unit 47.

When the state of the vibration corresponds to the state (b1) or (b2), the process proceeds to Step 14. Otherwise, the process is terminated.

In Step 14, the vibration state determination unit 55 determines whether the abnormal state is significant.

For example, in case of the abnormal state (b1), when the difference between the amplitude of the vibration and the threshold value exceeds a specified value, it is determined that the abnormal state is significant. Otherwise, it is not determined that the abnormal state is significant.

In case of the abnormal state (b2), when the difference between the ratio R of the amplitude and the threshold value exceeds a specified value, it is determined that the abnormal state is significant. Otherwise, it is not determined that the abnormal state is significant.

When the abnormal state is significant, the process proceeds to Step 15. When the abnormal state is not significant, the process proceeds to the Step 6.

In Step 15, the determination result output unit 63 outputs the failure signal to the driving cab monitor 39, and, using the communication device 41, transmits the failure signal to the operation center 43. The driving cab monitor 39 displays the warning image in accordance with the failure signal.

3. Effect Produced by Monitoring System 1

Effect (1A): The monitoring system 1 acquires the image including the collector shoe 13 within an angle of view, recognizes the event related to the collector shoe 13 in the image, and determines whether the recognized event corresponds to the abnormal event. Further, the monitoring system 1 outputs the signal including the result of determination. As a result, train crews of the railroad vehicle 10 and staff members of the operation center 43 can find failures related to the collector shoe 13 at early stage.

Effect (1B): The monitoring system 1 acquires an image on condition that the state of the collected current corresponds to the abnormal state or the state of the vibration in the collector shoe corresponds to the abnormal state. Therefore, as compared to a method of constantly acquiring an image, the load of processing executed by the monitoring system 1 can be reduced.

Effect (1C): The monitoring system 1 sets the states (a1) to (a3) as the abnormal states related to the state of the collected current. As a result, whether the state of the collected current corresponds to the abnormal state can be determined more accurately.

Effect (1D): The monitoring system 1 set the states (b1) and (b2) as the abnormal state related to the state of the vibration in the collector shoe 13. As a result, whether the state of the vibration corresponds to the abnormal state can be determined more accurately.

Effect (1E): The monitoring system 1 recognizes, as the event related to the collector shoe 13, the shape of the collector shoe 13, adhesion of a foreign matter to the collector shoe 13, operation of the collector shoe 13, inclination of the collector shoe 13, and an arc light generated between the collector shoe 13 and the overhead line. As a result, failures related to the collector shoe 13 can be broadly detected.

Effect (1F): In case that the event related to the collector shoe 13 corresponds to the abnormal event, the monitoring system 10 reduces the speed of the railroad vehicle 10. As a result, safety of the railroad vehicle 10 is improved.

Effect (1G): The monitoring system 1, when the speed of the railroad vehicle 10 is decreased, outputs a signal specific to the case. As a result, the train crews of the railroad vehicle 10 and the staff members of the operation center 43 can easily understand the situation of the railroad vehicle 10.

Effect (1H): The monitoring system 1 outputs the data of the image to the driving cab monitor 39, and transmits the data to the operation center 43. As a result, the train crews of the railroad vehicle 10 and the staff members of the operation center 43 can easily understand the situation of the current collector 3.

Effect (1I): The monitoring system 1 outputs the vehicle information to the driving cab monitor 39, and transmits the vehicle information to the operation center 43. As a result, the train crews of the railroad vehicle 10 and the staff members of the operation center 43 can easily understand the situation of the railroad vehicle 10.

Second Embodiment

The second embodiment has the same basic configuration as the first embodiment. Thus, description on the common components is not repeated, and the difference will be mainly described.

Figure 4:
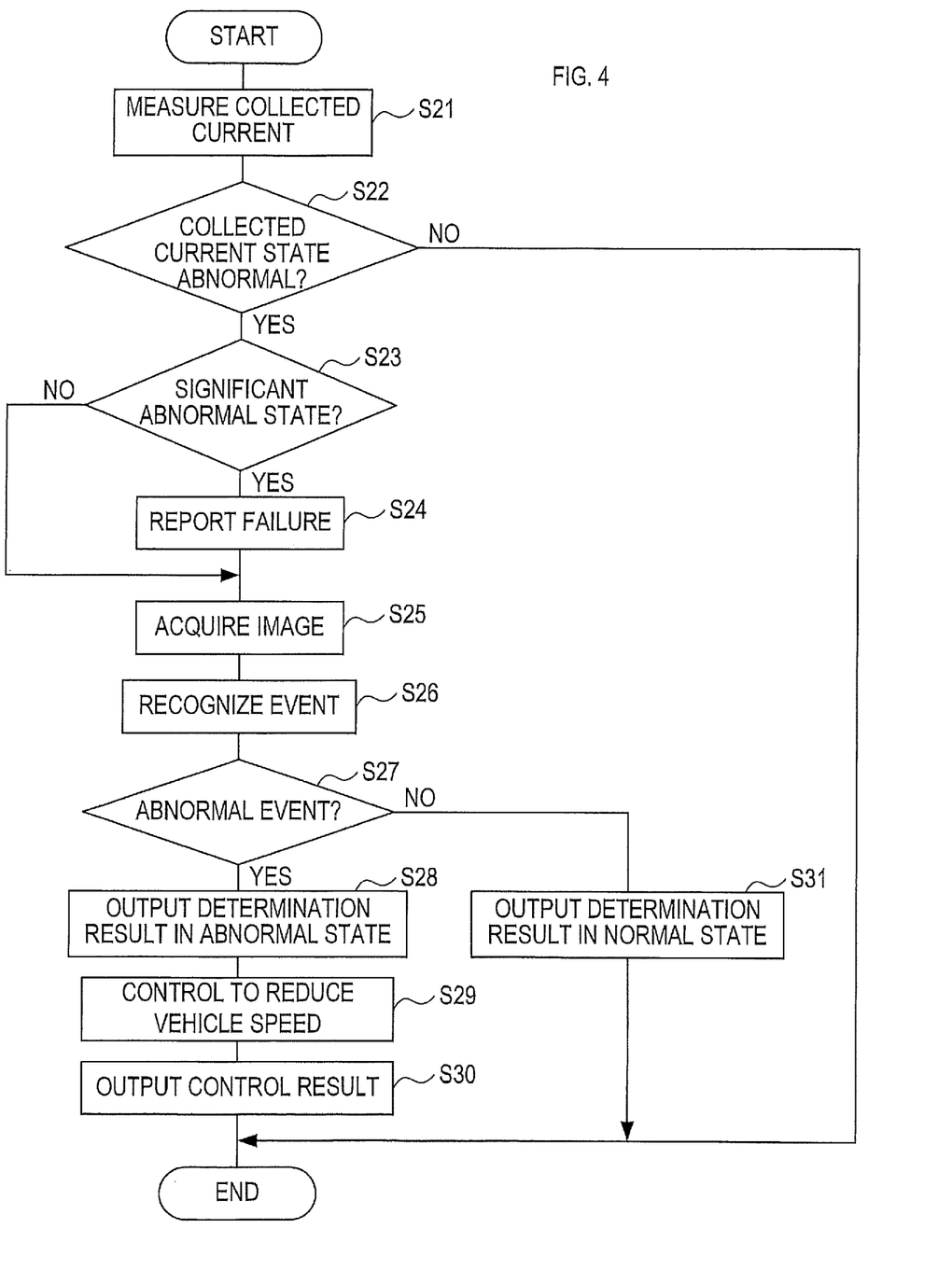
FIG. 4 is a flowchart showing a process executed by the current collector monitoring system according to a second embodiment.

The monitoring system 1 (especially, control device 21) of the present embodiment repeats a process shown in FIG. 4 at a specified cycle.

In Step 21 of FIG. 4, the collected current measurement unit 49, using the first clamp meter 29, measures the value of the corresponding collected current continuously for a specified period of time. Also, the collected current measurement unit 49, using the second clamp meter 31, measures the value of the adjacent collected current continuously for a specified period of time. The results of the measurements are stored in the storage unit 47.

In Step 22, the collected current state determination unit 51 determines whether the state of the collected current measured in Step 21 corresponds to the preset abnormal state. The determination method is the same as that of the first embodiment. If the state of the collected current corresponds to the abnormal state, then the process proceeds to Step 23. Otherwise, the process is terminated.

In Step 23, the collected current state determination unit 51 determines whether the abnormal state is significant. The determination method is the same as that of the first embodiment. If the abnormal state is significant, then the process proceeds to Step 24. If the abnormal state is not significant, then the process proceeds to Step 25.

In Step 24, the determination result output unit 63 outputs the failure signal to the driving cab monitor 39, and, using the communication device 41, transmits the failure signal to the operation center 43. The driving cab monitor 39 displays the warning image in accordance with the failure signal.

The processes in Step 25 to Step 31 are the same as Step 6 to Step 12 of the first embodiment.

According to the second embodiment detailed in the above, in addition to the effects (1A), (1C), and (1E)~(1I) of the above-described first embodiment, the following effect (2A) can be acquired.

Effect (2A): The monitoring system 1 acquires an image on condition that the state of the collected current corresponds to the abnormal state. Therefore, as compared to the method of constantly acquiring an image, the load of processing executed by the monitoring system 1 can be reduced.

Third Embodiment

The third embodiment has the same basic configuration as the first embodiment. Thus, description on the common components is not repeated, and the difference will be mainly described.

Figure 5:
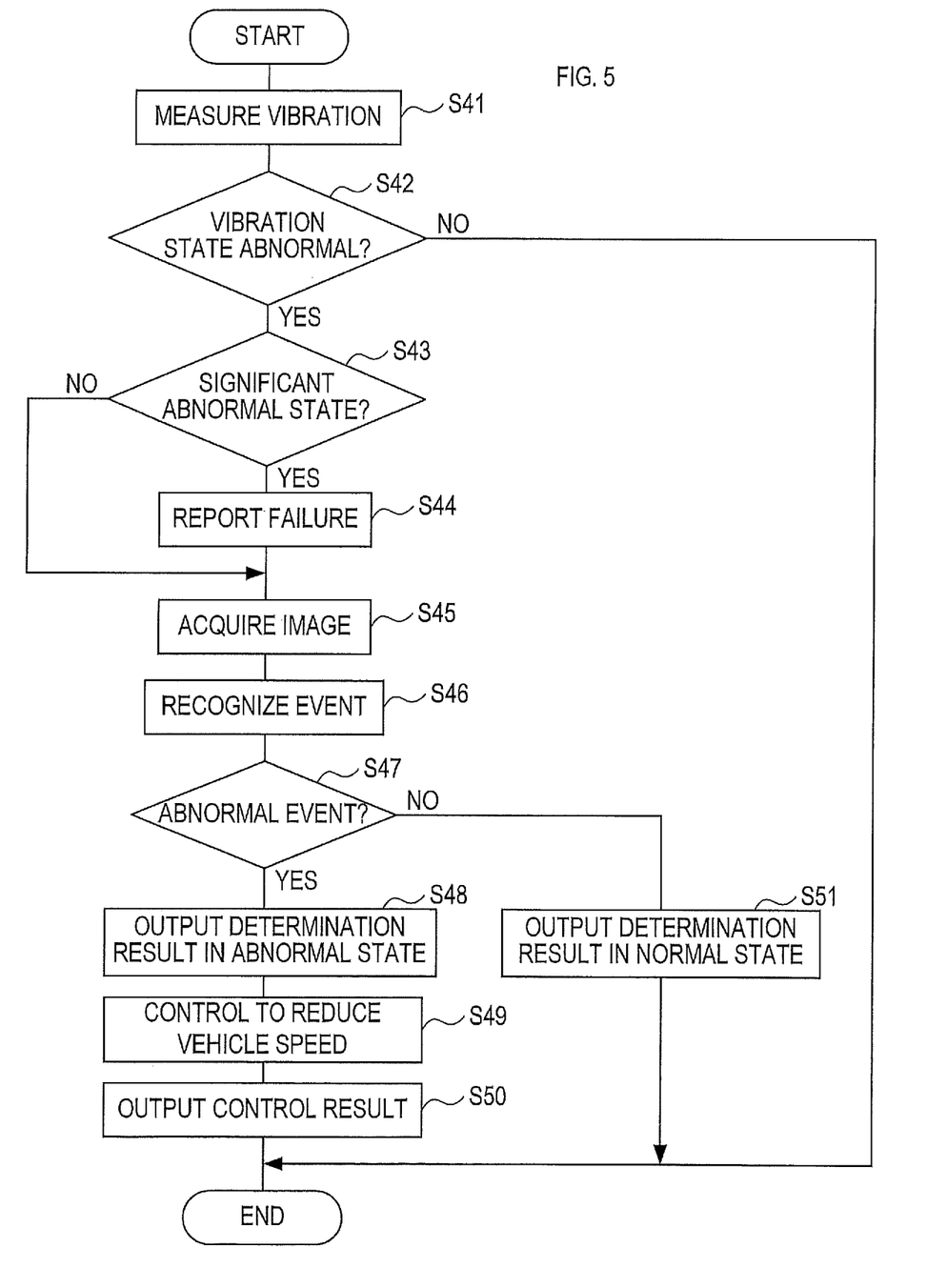
FIG. 5 is a flowchart showing a process executed by the current collector monitoring system according to a third embodiment.

The monitoring system 1 (especially, control device 21) of the present embodiment repeats a process shown in FIG. 5 at a specified cycle.

In Step 41 of FIG. 5, the vibration measurement unit 53, using the acceleration sensor 27, measures the accelerations of the collector shoe 13 continuously for a specified period of time. As a result, the data of the accelerations of the collector shoe 13 changing in time series can be acquired. The data show the vibration of the collector shoe 13. Also, in Step 41, in addition to the measurement of the accelerations, the speed of the railroad vehicle 10 is measured, using the vehicle speed sensor 33. The data of the accelerations of the collector shoe 13 changing in time series and the speed of the railroad vehicle 10 are stored in the storage unit 47.

In Step 42, the vibration state determination unit 55 determines whether the state of the vibration of the collector shoe 13 shown in the data acquired in the Step 41 corresponds to the preset abnormal state. The determination method is the same as that of the first embodiment.

When the state of the vibration corresponds to the abnormal state, the process proceeds to Step 43. When the state of the vibration does not correspond to the abnormal state, the process is terminated.

In Step 43, the vibration state determination unit 55 determines whether the abnormal state is significant. The determination method is the same as that of the first embodiment. When the abnormal state is significant, the process proceeds to Step 44. When the abnormal state is not significant, the process proceeds to Step 45.

In Step 44, the determination result output unit 63 outputs the failure signal to the driving cab monitor 39, and, using the communication device 41, transmits the failure signal to the operation center 43. The driving cab monitor 39 displays the warning image in accordance with the failure signal.

The processes in Step 45 to Step 51 are the same as the processes of Step 6 to Step 12 of the first embodiment.

According to the third embodiment detailed in the above, in addition to the effects (1A), and (1D) to (1I) of the above-described first embodiment, the following effect (3A) can be acquired.

Effect (3A): The monitoring system 1 acquires an image on condition that the state of the vibration in the collector shoe 13 corresponds to the abnormal state. Therefore, as compared to the method of constantly acquiring an image, the load of processing executed by the monitoring system 1 can be reduced.

Other Embodiments

Example embodiments of the present disclosure have been described in the above. The present disclosure is not limited to the above-described example embodiments, and can take various modes.

Variation (1): The abnormal state related to the collected current is not limited to those described in the above, and can be set as appropriate. Also, the abnormal state related to the vibration of the collector shoe 13 is not limited to those described in the above, and can be set as appropriate.

Variation (2): The event related to the collector shoe 13 recognized in the image is not limited to those described in the above, and can be set as appropriate.

Variation (3): The monitoring system 1 may have just one single camera. In that case, in the image acquired by the single camera, the shape of the collector shoe 13, adhesion of a foreign matter to the collector shoe 13, operation of the collector shoe 13, inclination of the collector shoe 13, and an arc light can be recognized.

Variation (4): One monitoring system 1 may monitor two or more current collectors 3.

The invention claimed is:

1. A current collector monitoring system comprising:
a collected current measurement unit configured to measure a collected current collected by a current collector;
a collected current state determination unit configured to determine whether a state of the collected current corresponds to a preset abnormal state;
an image acquisition unit configured to acquire an image including a collector shoe provided in the current collector within an angle of view in response to the state of the collected current corresponding to the abnormal state;
an event recognition unit configured to recognize an event related to the collector shoe in the image;
an event determination unit configured to determine whether the event corresponds to a preset abnormal event; and
a determination result output unit configured to output a signal containing a result of determination made by the event determination unit.

2. The current collector monitoring system according to claim 1, wherein
the abnormal state includes one or more of the following states: (a1) a state in which a magnitude of the collected current is out of a preset normal range; (a2) a state in which frequency of occurrence of no current state is equal to or higher than a threshold value; and (a3) a deviation in magnitude of the collected current between two or more of the current collectors is equal to or higher than a threshold value.

3. The current collector monitoring system according to claim 1, wherein
the event includes one or more of: a shape of the collector shoe; adhesion of a foreign matter to the collector shoe;

operation of the collector shoe; inclination of the collector shoe; and an arc light generated between the collector shoe and an overhead line.

4. The current collector monitoring system according to claim 1, further comprising:
a vehicle control unit configured to perform control in which a speed of a vehicle mounting the current collector is reduced when the event corresponds to the abnormal event.

5. The current collector monitoring system according to claim 4, further comprising:
a control result output unit configured to output a specific signal when the vehicle control unit performs the control in which the speed of the vehicle is reduced.

6. The current collector monitoring system according to claim 1, wherein the determination result output unit is further configured to output data of the image.

7. The current collector monitoring system according to claim 1, further comprising:
a vehicle information acquisition unit configured to acquire vehicle information including one or more of: a speed of a vehicle mounting the current collector; a position of the vehicle, and an output current value of the vehicle,
wherein the determination result output unit is further configured to output the vehicle information.

8. The current collector monitoring system according to claim 1, wherein:
the collected current measurement unit is configured to continuously measure (i) the collected current and (ii) a collected current collected by another current collector adjacent to the current collector for a certain period of time.

9. The current collector monitoring system according to claim 1, wherein:
the determination result output unit is configured to output a failure signal when the collected current state determination unit determines (i) that the state of the collected current corresponds to the abnormal state and (ii) that the abnormal state is significant.

10. The current collector monitoring system according to claim 9, wherein:
the determination result output unit is configured to transmit the failure signal to an operation center for a railroad vehicle via a communication device.

11. A current collector monitoring system comprising:
a vibration measurement unit configured to measure vibration of a collector shoe provided in a current collector;
a vibration state determination unit configured to determine whether a state of the vibration corresponds to a preset abnormal state;
an image acquisition unit configured to acquire an image including the collector shoe within an angle of view in response to the state of the vibration to the abnormal state;
an event recognition unit configured to recognize an event related to the collector shoe in the image;
an event determination unit configured to determine whether the event corresponds to a preset abnormal event; and
a determination result output unit configured to output a signal containing a result of determination made by the event determination unit.

12. The current collector monitoring system according to claim 11, wherein the abnormal state is (b1) a state in which an amplitude of the vibration is equal to or greater than a threshold value, and/or (b2) a state in which a ratio of the amplitude when a speed of a vehicle mounting the current collector is at a second speed, which is higher than a first speed, to the amplitude at the first speed is smaller than a threshold value.

13. The current collector monitoring system according to claim 11, wherein
the event includes one or more of: a shape of the collector shoe; adhesion of a foreign matter to the collector shoe; operation of the collector shoe; inclination of the collector shoe; and an arc light generated between the collector shoe and an overhead line.

14. The current collector monitoring system according to claim 11, further comprising:
a vehicle control unit configured to perform control in which a speed of a vehicle mounting the current collector is reduced when the event corresponds to the abnormal event.

15. The current collector monitoring system according to claim 14, further comprising:
a control result output unit configured to output a specific signal when the vehicle control unit performs the control in which the speed of the vehicle is reduced.

16. The current collector monitoring system according to claim 11, wherein
the determination result output unit is further configured to output data of the image.

17. The current collector monitoring system according to claim 11, further comprising:
a vehicle information acquisition unit configured to acquire vehicle information including one or more of: a speed of a vehicle mounting the current collector; a position of the vehicle, and an output current value of the vehicle,
wherein the determination result output unit is further configured to output the vehicle information.

18. The current collector monitoring system according to claim 11, wherein:
the current collector is mounted on a railroad vehicle, and
the vibration measurement unit is configured to continuously measure (i) respective accelerations in an up-down direction, a front-rear direction, and a width direction of the collector shoe and (ii) a speed of the railroad vehicle for a certain period of time.

19. The current collector monitoring system according to claim 11, wherein:
the determination result output unit is configured to output a failure signal when the vibration state determination unit determines (i) that the state of the vibration corresponds to the abnormal state and (ii) that the abnormal state is significant.

20. The current collector monitoring system according to claim 19, wherein:
the determination result output unit is configured to transmit the failure signal to an operation center for a railroad vehicle via a communication device.

* * * * *